(12) United States Patent
Shelby et al.

(10) Patent No.: US 10,601,445 B2
(45) Date of Patent: Mar. 24, 2020

(54) WIRELESS TRANSPORT FRAMEWORK WITH UNCODED TRANSPORT TUNNELING

(71) Applicant: Coherent Logix, Incorporated, Austin, TX (US)

(72) Inventors: Kevin A. Shelby, Austin, TX (US);
Peter J. Nysen, San Jose, CA (US);
Michael B. Doerr, Dripping Springs, TX (US)

(73) Assignee: Coherent Logix, Incorporated, Austin, TX (US)

( * ) Notice: Subject to any disclaimer, the term of this patent is extended or adjusted under 35 U.S.C. 154(b) by 37 days.

(21) Appl. No.: 15/953,666

(22) Filed: Apr. 16, 2018

(65) Prior Publication Data

US 2018/0234111 A1    Aug. 16, 2018

Related U.S. Application Data

(63) Continuation of application No. 13/707,172, filed on Dec. 6, 2012, now Pat. No. 9,960,787, which is a
(Continued)

(51) Int. Cl.
*H03M 13/00* (2006.01)
*H03M 13/05* (2006.01)
(Continued)

(52) U.S. Cl.
CPC ........... *H03M 13/05* (2013.01); *H03M 13/29* (2013.01); *H03M 13/2906* (2013.01);
(Continued)

(58) Field of Classification Search
CPC .. H03M 13/05; H03M 13/29; H03M 13/2906; H03M 13/2909; H03M 13/2957;
(Continued)

(56) References Cited

U.S. PATENT DOCUMENTS

| 6,125,147 A | 9/2000 | Florencio et al. |
| 6,691,227 B1 | 2/2004 | Neves et al. |

(Continued)

FOREIGN PATENT DOCUMENTS

| WO | 0203678 | 1/2002 |
| WO | 2007046677 | 4/2007 |
| WO | 2007138283 | 12/2007 |

OTHER PUBLICATIONS

"ATSC Digital Television Standard Part 2—RF/Transmission System Characteristics (A/53, Part 2:2007)"; Advanced Television Systems Committee; Jan. 3, 2007; 44 pages.
(Continued)

*Primary Examiner* — Samir W Rizk
(74) *Attorney, Agent, or Firm* — Kowert Hood Munyon Rankin and Goetzel PC; Jeffrey Hood

(57) ABSTRACT

Wireless transport of multiple service versions of a transport framework. First and second information may be processed for transmission, respectively, according to first and second service versions of a transport framework. The first and second information may be encoded using a first type of error correction coding; after processing, the processed first information may include error correction coding according to the first type of error correction coding, while the processed second information may remain uncoded according to the first type of error correction coding. Control information may be generated indicating that the second information remains uncoded according to the first type of error correction coding, which may signal to receivers that the second information is processed according to the second service version of the transport framework. Packets including the processed first information, the processed second information, and the control information may be generated and transmitted in a wireless manner.

20 Claims, 11 Drawing Sheets

Related U.S. Application Data continuation of application No. 12/474,595, filed on May 29, 2009, now Pat. No. 8,358,705, which is a continuation-in-part of application No. 12/167,708, filed on Jul. 3, 2008, now Pat. No. 8,151,305.

(60) Provisional application No. 60/948,185, filed on Jul. 5, 2007, provisional application No. 60/958,585, filed on Jul. 5, 2007, provisional application No. 60/999,039, filed on Oct. 14, 2007, provisional application No. 61/130,344, filed on May 31, 2008.

(51) Int. Cl.

| | | |
|---|---|---|
| *H03M 13/29* | (2006.01) | |
| *H04H 20/95* | (2008.01) | |
| *H04H 60/07* | (2008.01) | |
| *H04N 21/2381* | (2011.01) | |
| *H04N 21/2383* | (2011.01) | |
| *H04N 21/414* | (2011.01) | |
| *H04N 21/438* | (2011.01) | |
| *H04N 21/61* | (2011.01) | |
| *H04N 21/6437* | (2011.01) | |
| *H04L 29/06* | (2006.01) | |
| *H03M 13/11* | (2006.01) | |
| *H03M 13/27* | (2006.01) | |

(52) U.S. Cl.
CPC ... *H03M 13/2909* (2013.01); *H03M 13/2957* (2013.01); *H03M 13/6583* (2013.01); *H04H 20/95* (2013.01); *H04H 60/07* (2013.01); *H04L 65/4076* (2013.01); *H04N 21/2381* (2013.01); *H04N 21/2383* (2013.01); *H04N 21/41407* (2013.01); *H04N 21/4381* (2013.01); *H04N 21/4382* (2013.01); *H04N 21/6131* (2013.01); *H04N 21/6437* (2013.01); *H03M 13/1102* (2013.01); *H03M 13/2732* (2013.01); *H03M 13/2936* (2013.01)

(58) Field of Classification Search
CPC ......... H03M 13/6583; H03M 13/1182; H03M 13/2732; H04N 21/2381; H04N 21/2383; H04N 21/41407; H04N 21/4381; H04N 21/4382; H04N 21/6131; H04N 21/6437
See application file for complete search history.

(56) References Cited

U.S. PATENT DOCUMENTS

| | | | |
|---|---|---|---|
| 6,728,296 | B1 | 4/2004 | Yung |
| 6,744,822 | B1 | 6/2004 | Gaddam et al. |
| 6,760,077 | B2 | 7/2004 | Choi et al. |
| 6,914,560 | B2 | 7/2005 | Spilker, Jr. et al. |
| 7,206,352 | B2 | 4/2007 | Birru et al. |
| 7,337,386 | B2 | 2/2008 | Chang et al. |
| 7,643,478 | B2 | 1/2010 | Lecomte et al. |
| 7,986,704 | B2 | 7/2011 | Karaoguz et al. |
| 8,024,768 | B2 | 9/2011 | Berger et al. |
| 8,094,749 | B2 | 1/2012 | Hansen et al. |
| 2003/0207696 | A1 | 11/2003 | Willenegger et al. |
| 2004/0028076 | A1 | 2/2004 | Strolle et al. |
| 2004/0057535 | A1 | 3/2004 | Strolle et al. |
| 2004/0101046 | A1 | 5/2004 | Yang et al. |
| 2006/0244865 | A1 | 11/2006 | Simon |
| 2006/0262651 | A1 | 11/2006 | Cooper et al. |
| 2007/0002734 | A1 | 1/2007 | Kim et al. |
| 2007/0064707 | A1 | 3/2007 | Pandel et al. |
| 2007/0081595 | A1 | 4/2007 | Choi et al. |
| 2007/0147440 | A1 | 6/2007 | Song et al. |
| 2007/0211655 | A1 | 9/2007 | Lin et al. |
| 2007/0247395 | A1 | 10/2007 | Barraclough et al. |
| 2007/0286112 | A1 | 12/2007 | Prakash et al. |
| 2009/0193487 | A1 | 7/2009 | Simon |

OTHER PUBLICATIONS

"Modulation and Coding Requirements for Digital TV (DTV) Applications Over Satellite—ATSC Standard"; Advanced Television Systems Committee; Jul. 17, 1999; 33 pages.

International Search Report and Written Opinion, PCT/US2009/045487, dated Oct. 29, 2009, 17 pages.

Jill M. Boyce; "Packet loss resilient transmission of MPEG video over the Internet"; Signal Processing: Image Communication 15 (1999), pp. 7-24.

Mugen Peng and Wenbo Wang; "A Unified Architecture and Key Techniques for Interworking between WiMAX and Beyond 3G/4G Systems"; Oct. 2, 2007; pp. 67-90.

International Search Report and Written Opinion, PCT/US2009/045763, dated Nov. 4, 2009, 15 pages.

O. Simeone and U. Spagnolini; "Adaptive Pilot Pattern for OFDM Systems"; IEEE Communications Society; 2004; pp. 978-982.

Yuze Zhang, Michael P. Fitz, and Saul B. Gelfand; A Performance Analysis and Design of Equalization with Pilot Aided Channel Estimation; IEEE; 1997; pp. 720-724.

Cai et al.; "Cell Search Frequency Synchronization for Beyond 3G"; IEEE 6th CAS Symp. on Emerging Technologies: Mobile and Wireless Comm., Shanghai, China, May 31-Jun. 2, 2004; pp. 45-48.

Fumiaki Tsuzuki and Tomoaki Ohtsuki; "SAGE Algorithm for Channel Estimation and Data Detection Using Superimposed Training in MIMO System"; IEEE; 2006; 3 pages.

Fumiaki Tsuzuki and Tomoaki Ohtsuki; "Channel Estimation with Selective Superimposed Pilot Sequences Under Fast Fading Environments"; IEEE; 2004; pp. 62-66.

International search report and written opinion for Application No. PCT/US2009/045650, dated Dec. 8, 2009; 16 pages.

"Annex D: RF/Transmission Systems Characteristics"; Digital Television Standard; XP-002187665; Sep. 16, 1995; 16 pages.

Touzni, A. et al.—"Enhanced 8-VSB Transmission for North-American HDTV Terrestrial Broadcast"—2003 IEEE International Conference on Acoustics, Speech, and Signal Processing—Apr. 6-10, 2003, vol. 2, pp. 437-440 (4 pages).

European Search Report for Application No. EP-15194554.0-1908, dated Jan. 22, 2016 (4 pages).

*Stream Encoding Methods*

| Transport Method | FEC | Modulation/Coding | Sync |
|---|---|---|---|
| Robust Stream | LDPC + 8-VSB | — | Implicit |
| VSIW Over MPEG-2 TS | 8-VSB | OGold-16 | Explicit |
| VSIW Over Robust Stream | LDPC + 8-VSB | OGold-16 | Implicit |
| VSIW Over Field Sync | None | 2-Level [5] | Implicit |

*Stream parameter encoding*

| Field | TS-Field | Description | Size | Contents |
|---|---|---|---|---|
| SYNC | | Stream synchronization | 12-bits | $7712_8$ |
| VSIWTS | LEN | Number of octets contained in the DATA field (after code-spread demodulation) | 8-bits w/ext. | [0:254] → [1:255 Octets] [255] → extends LEN field an additional 8-bits |
| | VSIW | VSIW Packet data (zero padded to nearest octet boundary) | N-bits | VSIW Packet |
| | CRC | Cyclic Redundancy Check calculated over the LEN\|DATA fields | 16-bits | CRC-16 CCITT $x^{16}+x^{12}+x^5+1$ |

FIG. 12

WIRELESS TRANSPORT FRAMEWORK WITH UNCODED TRANSPORT TUNNELING

PRIORITY CLAIM

This application is a continuation of U.S. application Ser. No. 13/707,172 titled "Wireless Transport Framework with Uncoded Transport Tunneling" filed on Dec. 6, 2012, which is a continuation of U.S. application Ser. No. 12/474,595, titled "Transmission of Multimedia Streams to Mobile Devices with Uncoded Transport Tunneling" filed on May 29, 2009, now U.S. Pat. No. 8,358,705 issued on Jan. 22, 2013, which is a continuation-in-part of U.S. application Ser. No. 12/167,708 titled "Mobile Television Broadcast System" filed on Jul. 3, 2008, now U.S. Pat. No. 8,151,305 issued on Apr. 3, 2012, which claims benefit of priority to provisional application Ser. No. 60/948,185 tiled "Robust Mobile TV Broadcast System" filed Jul. 5, 2007, Ser. No. 60/958,585 titled "Robust Mobile TV Broadcast System" filed Jul. 5, 2007, and Ser. No. 60/999,039 titled "Robust Mobile TV Broadcast System" filed Oct. 14, 2007, all of which are hereby incorporated by reference in their entirety as though fully and completely set forth herein.

U.S. application Ser. No. 12/474,595 claims benefit of priority to provisional application Ser. No. 61/130,344 titled "Enhanced Mobile TV System" filed on May 31, 2008, which is hereby incorporated by reference in its entirety as though fully and completely set forth herein.

The claims in the instant application are different than those of the parent application or other related applications. The Applicant therefore rescinds any disclaimer of claim scope made in the parent application or any predecessor application in relation to the instant application. The Examiner is therefore advised that any such previous disclaimer and the cited references that it was made to avoid, may need to be revisited. Further, any disclaimer made in the instant application should not be read into or against the parent application or other related applications.

FIELD OF THE INVENTION

The present invention relates to a mobile television broadcast system, and more specifically in one embodiment relates to enhancement of the current ATSC Digital TV broadcast system for mobile services to mobile and handheld devices.

DESCRIPTION OF THE RELATED ART

The ATSC (Advanced Television Systems Committee) standard relates to a digital television format which will replace the analog NTSC television system. The ATSC standard is a high definition television standard that produces standard 4:3 or wide screen 16:9 images up to 1920×1080 pixels in size—more than six times the display resolution of the earlier NTSC standard. The ATSC standard makes provisions to transport multiple standard-definition "virtual channels" broadcast on a single 6 MHz TV channel. The ATSC standard also includes "theater quality" audio using the Dolby Digital AC-3 format to provide 5.1-channel surround sound. The ATSC standard also provides numerous auxiliary datacasting services.

The ATSC standard uses the MPEG-2 systems specification for encapsulation (transport) of data. More specifically, ATSC uses the 188-byte MPEG transport stream packets to carry data. MPEG-2 is also referred to as "transport stream", "MPEG-TS", or simply "TS". At the receiver side, before decoding of audio and video occurs, the receiver demodulates and applies error correction to the signal. Then, the transport stream may be demultiplexed into its constituent streams. A video codec, e.g. MPEG-2, H.264, VC-1, is used for encoding and decoding video, subject to certain constraints.

Previously, mobile reception of digital television stations transmitted using the ATSC standard has been difficult to impossible. For example, mobile reception of digital television stations is very difficult when moving at vehicular speeds. Furthermore, as the ATSC standard is developed and extended, including improvements for mobile reception, a way to blend the extensions into the system, preferably within an existing framework, is desirable. Therefore, there is a need for an improved system and method for transmission and/or reception of digital television signals for improved mobile reception.

SUMMARY OF THE INVENTION

Various embodiments are presented of a system and method for wirelessly communicating audiovisual information. One set of embodiments involves a system and method for wirelessly transmitting audiovisual information to a mobile device. Another set of embodiments involves a system and method for wirelessly receiving audiovisual information by a mobile device. The audiovisual information may be packetized according to the ATSC (Advanced Television Standards Committee) standard, e.g., using 8-VSB modulation The method for transmitting audiovisual information to a mobile device may include encoding first audiovisual information using a first error correction coding method. In one embodiment, the first error correction coding method may be a convolutional encoding method. A plurality of packets may be generated, including the first audiovisual information. The plurality of packets may also include second audiovisual information, and control information. The second audiovisual information may not be encoded using the first error correction coding method. For example, the second audiovisual information may be encoded using a second error correction coding method. For example, the second audiovisual information may be encoded using a systematic block coding method.

The first audiovisual information and the second audiovisual information may be located in different packets of the plurality of packets. In other words, one or more packets may include the first audiovisual information, while one or more different packets may include the second audiovisual information. Alternatively, some or all of the packets may include both first audiovisual information and second audiovisual information. In other words, at least part of the first audiovisual information and at least part of the second audiovisual information may be co-located in at least one packet of the plurality of packets.

The plurality of packets may also include control information. The control information may indicate that the second audiovisual information is not encoded according to the first error correction coding method. The control information may also indicate that the first audiovisual information is encoded using the first error correction coding method. The control information may be usable by a receiver to determine that the second audiovisual information is not encoded according to the first error correction coding method. The receiver may be configured to recognize information that is uncoded according to the first error correction coding method as a different service or service version than information that is coded according to the first error correction coding method. Thus, a receiver's determination that the second audiovisual information is not encoded according to the first error correction coding method may thereby indicate to the receiver that the second audiovisual information is a different service version than the first audiovisual information.

The control information may be included in the same packets as the first and/or the second audiovisual information. Alternatively, the control information and the audiovisual information may be located in different packets. In other words, the first and second audiovisual information may be located in one or more packets, while the control information may be located in a different one or more packets.

The plurality of packets may be transmitted in a wireless manner. Thus, the packets may be transmitted to a mobile device, e.g., including a receiver. The plurality of packets may be transmitted by a transmitter, e.g., including an antenna.

The method for wirelessly transmitting audiovisual information to a mobile device may be performed partially or entirely by a system, which in various embodiments may include some or all of: memory for storing the audiovisual information; transmit logic coupled to the memory and configured to generate the packets and the control information; and a transmitter for transmitting the pluralities of packets.

The method for wirelessly receiving and presenting audiovisual information by a mobile device may include receiving a plurality of packets in a wireless manner. The plurality of packets may include first audiovisual information and second audiovisual information. The first audiovisual information may be encoded using a first error correction coding method, while the second audiovisual information may not be encoded using the first error correction coding method. The first error correction coding method may be a convolutional encoding method, according to one embodiment. The second audiovisual information, although not encoded according to the first error correction coding method, may be encoded using a second error correction coding method. For example, the second audiovisual information may be encoded using a systematic block coding method.

The first audiovisual information and the second audiovisual information may be located in different packets of the plurality of packets. In other words, one or more packets may include the first audiovisual information, while one or more different packets may include the second audiovisual information. Alternatively, some or all of the packets may include both first audiovisual information and second audiovisual information. In other words, at least part of the first audiovisual information and at least part of the second audiovisual information may be co-located in at least one packet of the plurality of packets.

The plurality of packets may also include control information. The control information may indicate that the second audiovisual information is not encoded according to the first error correction coding method. The control information may also indicate that the first audiovisual information is encoded using the first error correction coding method.

The control information may be included in the same packets as the first and/or the second audiovisual information. Alternatively, the control information and the audiovisual information may be located in different packets. In other words, the first and second audiovisual information may be located in one or more packets, while the control information may be located in a different one or more packets.

The mobile device may determine, based on the control information, that the second audiovisual information is not encoded according to the first error correction coding method. Because of this, the mobile device may determine that the second audiovisual information is a different service version than the first audiovisual information. Depending on which service version(s) the mobile device is configured to present, at least a portion of the audiovisual information (e.g., either part or all of the first audiovisual information, or part of all of the second audiovisual information, or both) may be presented on the mobile device. This may include presenting (e.g., displaying) video information on a display and/or presenting (e.g., playing) audio information on one or more speakers.

The method for wirelessly receiving audiovisual information by a mobile device may be performed by a mobile device. The mobile device may include an antenna for wirelessly receiving the packets, receiver logic coupled to the antenna for processing the audiovisual and error correction coding information and presenting the processed audiovisual information, and a display and/or one or more speakers on which the audiovisual information may actually be presented.

Thus, the presence or lack of error correction coding according to a reference error correction coding method may be used to signal a different service version. In particular, this may be useful for providing a transmission system, and mobile devices for use with the transmission system, with forward compatibility. In other words, a transmission system may use a particular error correction coding method for its initial service version, but may also plan for and allow the possibility of not using that error correction coding method in a future service version, as a way of signaling that future service version, without needing to specify what the future service or service version may be at the time of the initial service launch. This is referred to herein as an 'uncoded transport tunnel', because it essentially provides a tunnel (data which is uncoded according to the first error correction coding method) within an existing transport framework, into which future services can be inserted without breaking the transport framework. Thus, in one embodiment, both legacy mobile devices which can only receive and present services from an earlier service version (e.g., the initial service launch), and newer mobile devices which can receive and present services from newer service versions, may be provisioned with audiovisual information within the same transport framework.

BRIEF DESCRIPTION OF THE DRAWINGS

A better understanding of the present invention can be obtained when the following detailed description of the preferred embodiment is considered in conjunction with the following drawings, in which:

FIG. 12 illustrates stream parameter encoding according to one embodiment of the invention.

Figure 1:
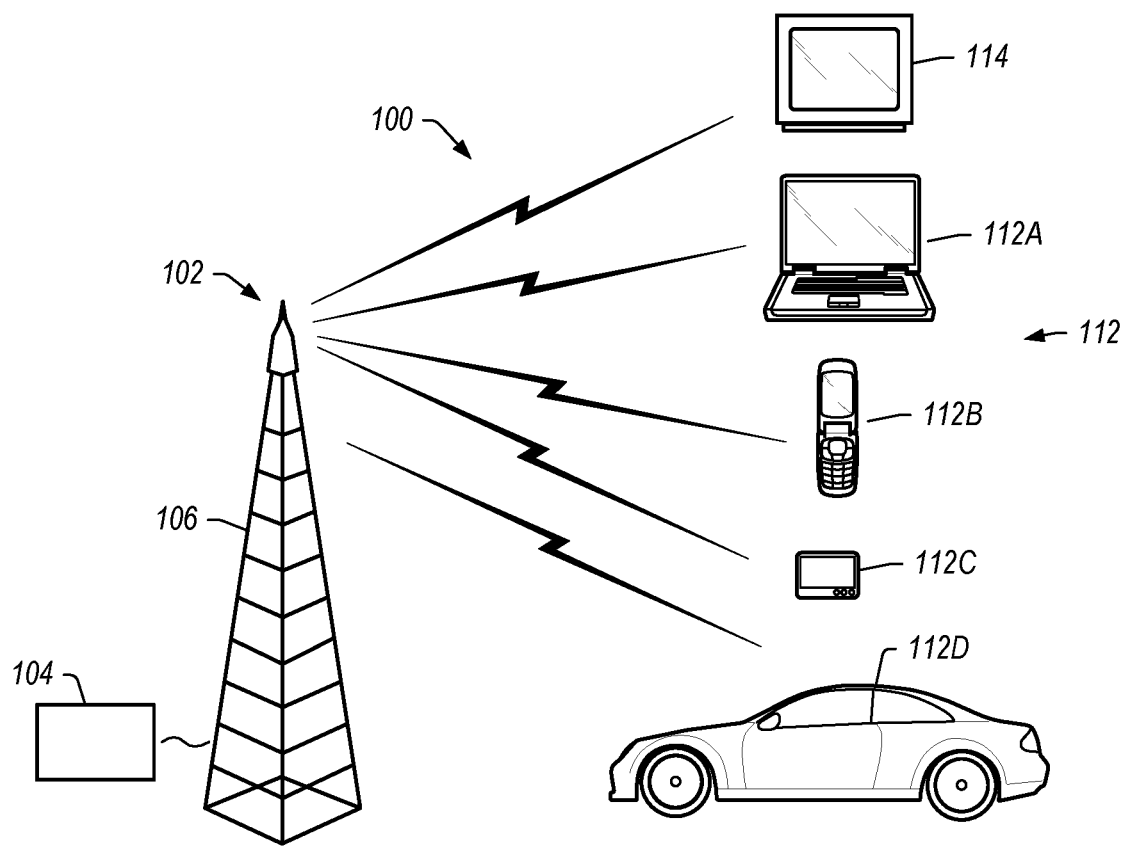
FIG. 1 illustrates a digital television broadcast system according to one embodiment.

While the invention is susceptible to various modifications and alternative forms, specific embodiments thereof are shown by way of example in the drawings and are herein described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

FIG. 1—Digital Television Broadcast System

FIG. 1 illustrates an exemplary broadcast system 100 according to one embodiment of the invention. In one embodiment, the broadcast system may be a digital television broadcast system. The broadcast system 100 described herein, including the various methods described herein, may be used for broadcasting any of various types of data, including audiovisual information as well as other data.

As used herein, the term "audiovisual information" includes any of various types of information or data that comprises video data and/or audio data. The term "video data" includes motion video (such as television, movies, streaming video, etc., as well as image data, such as JPEGs. The term "audiovisual information" further includes any of various types of information or program instructions that, when executed, cause a device to present video data (on a display) and/or audio data (on speakers). For example, the term "audiovisual information" includes any of various types of gaming content (including program instructions and/or data) that can be used and/or executed to present gaming content (e.g., images, video, and/or audio) on a presentation device.

The broadcast system 100 and the various methods described herein are described in the present application in the context of transmitting audiovisual information for presentation by a receiving device, in particular digital television. However, it is noted that the broadcast system 100 and the various methods described herein may be used for transmission/reception of any of various types of data (e.g., audiovisual information, email, files, text documents, seismic data, measurement data, weather data, etc.), with audiovisual information being merely one representative example.

In one set of embodiments, the broadcast system may operate according to the ATSC (Advanced Television Standards Committee) standard, e.g., using 8-VSB modulation. Alternatively, the broadcast system may operate according to a modified version of the ATSC standard, or according to another standard. For example, the Mobile/Handheld (M/H) modification of the ATSC standard is used for transmission of audiovisual information for moving receivers. The current M/H system transports M/H services in bursts alongside the main service stream encapsulated in NULL packets consistent with the methods prescribed for E-VSB service multiplexing. The system uses serial concatenated convolutional coding (SCCC) for additional robustness. To aid M/H reception, the existing M/H system supplements the base 8VSB transport with the addition of extra training multiplexed with the mobile packet data in such a way that the training data appears in contiguous bytes (2 full segments per training) at transmission. Thus, when it is available, a receiver can utilize this additional training information to update its equalizer in order to track fast moving channel conditions. Specific examples of the embodiments disclosed herein may be based on, or include portions of the M/H modification to the ATSC standard, and may also include further variations and modifications to M/H and the ATSC standard. However, the embodiments related to transmission of audiovisual information disclosed herein are not necessarily limited to use with the ATSC or M/H systems, and may be equally applicable for transmission of audiovisual information in accordance with other standards and/or modulations schemes, such as DVB-T/H, ISDB-T, DMB-T/H, etc.

As shown, the system 100 comprises a transmission system (or transmit system) 102, one or more mobile devices 112 (e.g., mobile devices 112A-112D), and at least one stationary device 114. As noted above FIG. 1 is exemplary only, e.g., an exemplary system may comprise one or more transmission systems 102, a plurality of mobile devices 112, and a plurality of stationary devices 114.

The transmission system 102 is configured to transmit audiovisual information to the one or more mobile devices 112 in a wireless manner. More particularly, the transmission system 102 may be configured to transmit digital television signals/channels to the mobile devices 112. The mobile devices 112 may receive and present the audiovisual information, e.g., receive and present the digital television signals/channels. The transmission system 102 may also be configured to transmit audiovisual information to the stationary device 114 (e.g., stationary television) in a wireless manner. The transmission system 102 is also configured to transmit audiovisual information to the one or more stationary devices 114, e.g., televisions.

For the sake of convenience, embodiments of the invention are described herein with respect to reception by mobile devices 112. However, the various embodiments of the invention described herein may also of course be used for reception by stationary devices. For example, one embodiment of the invention provides for reception of additional error correction information by stationary devices 114 for the purpose of enhancing the robustness of the terrestrial broadcast. Thus any of the various methods described herein may be utilized with either mobile devices 112 or stationary devices 114, or both, as desired.

The transmission system 102 comprises a transmitter 106 as well as transmit logic 104 coupled to the transmitter 106. The transmit logic 104 may comprise any of various types of logic, such as one or more computer systems (with accompanying software), digital logic, analog logic, programmable gate arrays, etc., or combinations thereof. The transmit logic 104 is adapted for receiving and/or storing audiovisual information (e.g., television data) and for generating packets containing the audiovisual information. The transmit logic 104 may generate packets according to any of various standards, such as the ATSC (Advanced Television Standards Committee) standard, e.g., using 8-VSB modulation. The transmission system 102 may use other modulation schemes, such as DVB-T/H, ISDB-T, DMB-T/H, etc. The transmit logic is also adapted for generating error correction coding information. For example, the transmit logic may be configured to encode data with any of various types of error correction techniques, including (but not limited to): convolutional coding (such as trellis encoding), block coding (such as Reed-Solomon encoding), or other error correction techniques. The transmit logic may be configured to encode data with more than one error correction technique. The transmit logic 104 is also configured to generate packets containing control information as described herein. In one embodiment, one or more of the digital television channels are intended for stationary receivers, such as televisions. One or more of the digital television channels may also be intended for mobile and/or handheld (M/H) (referred to collectively herein as "mobile") devices 112. In one embodiment, one or more of the digital television channels may be intended for either stationary receivers or mobile devices.

As described herein, for digital television channels intended for mobile devices 112 (and possibly for all channels, e.g., channels intended for stationary devices 114 and/or mobile devices 112), the transmit logic 104 may be configured to generate packets containing error correction coding information. For example, the transmit logic 104 may generate error correction coding information for audiovisual information, and may transmit the error correction coding information in a separate packet (or packets) than the audiovisual information, with another packet (or packets) containing control information for associating the error correction coding information with the audiovisual information. Thus, a receiver (such as a stationary receiver) which does not require or is not configured to use the error correction coding information may ignore the error correction coding information packet and simply receive the audiovisual information as a normal audiovisual stream, while a receiver (such as a mobile device) which does require additional error correction coding information and is configured to use the error correction coding information may associate the error correction coding information with the audiovisual information (e.g., based on the control information) and thereby achieve a more robust system.

Furthermore, the control information can be used by the transmit logic 104 to generate and transmit new types of error correction coding that is usable by the receiver. In one embodiment, a first part of the audiovisual information may be encoded using a first error correction coding method while a second part of the audiovisual information may not be encoded using the first error correction method; the second part of the audiovisual information may simply be uncoded, or may be encoded using a second error correction coding method. In some embodiments, multiple error correction coding methods may be used with some or all of the audiovisual information.

The mobile devices 112 may be any of various types of devices, such as portable computer systems (laptops) 112A, wireless telephones 112B (e.g., Blackberrys, iphones, etc.), personal digital assistants 112C, television equipment 112D configured in vehicles, and other types of portable devices capable of displaying received audiovisual information.

The mobile devices 112 are configured to wirelessly receive (e.g., with an antenna) the packets transmitted by the transmitter 106, including the packets containing audiovisual information, the packets containing error correction coding information, and the packets containing control information. A respective mobile device 112 may also include receiver logic for processing the received audiovisual information, as well as a display for presenting video information and one or more speakers for presenting audio information. Thus each of the mobile devices 112 may include television-like capabilities for presenting received television channels as described herein.

The stationary devices 114 may be any of various types of devices that are intended to be placed at a fixed location (referred to as stationary or "non-mobile"), such as conventional televisions, e.g., liquid crystal displays (LCD displays), plasma displays, etc.

Figure 2:
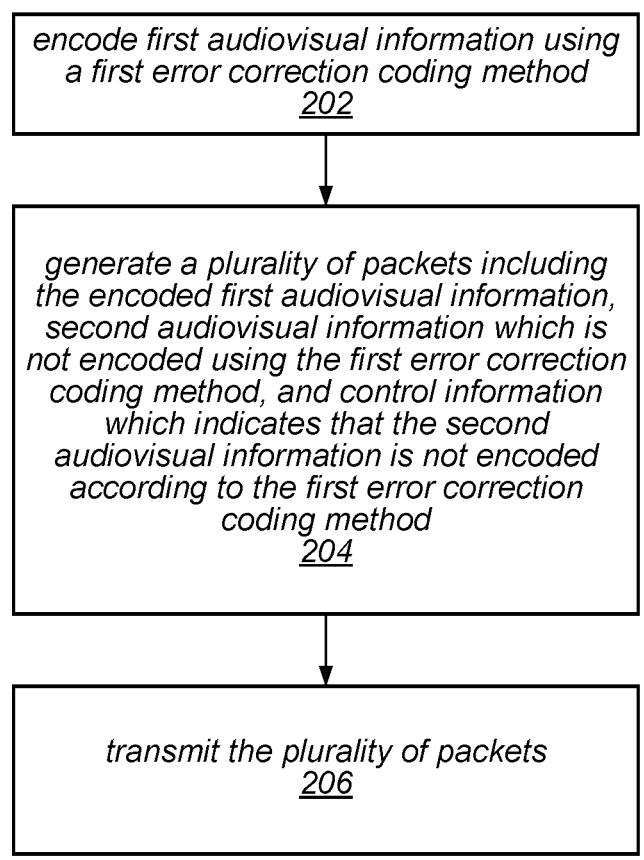
FIG. 2 is a flowchart diagram illustrating a method for wirelessly transmitting audiovisual information to a mobile device according to one embodiment.

FIG. 2—Transmit Flowchart

FIG. 2 is a flowchart depicting a method for transmitting audiovisual information. The method may be performed by a transmission system such as described above and shown in FIG. 1, e.g., a system including transmit logic and a transmitter. The audiovisual information may be for reception by mobile devices; alternatively, the audiovisual information may be for reception by stationary devices, or, both mobile and stationary devices. It should be noted that, according to various embodiments, one or more of the steps may be omitted, repeated, or performed in a different order than shown in FIG. 2 and described below.

The method may allow for 'uncoded transport tunneling', which, as used herein, refers to using 'uncoded' (at least according to a reference error correction coding method) data as a carrier for as-yet-undetermined future services. As part of developing a system, new services and versions of the system may be deployed, and a way to signal the new services and versions may be necessary. In a system which uses error correction coding, part of the development of the system may include improved and new error correction coding methods. Thus in some systems, it may make sense to use the presence, or lack of presence, of an error correction coding method to signal a new service and/or version. In one embodiment, the presence, or lack of presence, of an error correction coding method is used exclusively or primarily to signal a new service and/or version. Alternatively, or in addition, a base version of a system may use a first error correction coding method, but in a new version, the first error correction coding method may be unnecessary, e.g., because of improvements in another error correction coding method, or for any reason. Thus, a base version service may be encoded using the first error correction coding method, while a new version service may not be encoded using the first error correction coding method. In combination with appropriate control information, leaving this new service version 'uncoded' may thus provide a way to transport a new service version within a basic transport framework. In other words, uncoded transport tunneling may provide a means for future service expansion within an existing framework, and providing this capability from the original design of the base transport framework may give the system significant forward compatibility, potentially extending the useful lifespan of the transport framework.

In general, the method described herein may be used for any appropriate system, e.g., any system which uses error correction coding and in which forward compatibility is desirable. Thus, while embodiments of the method may be described herein primarily with reference to the ATSC and M/H systems, the method may not be limited to these systems, and should be considered with this broader scope in mind.

Figure 4:
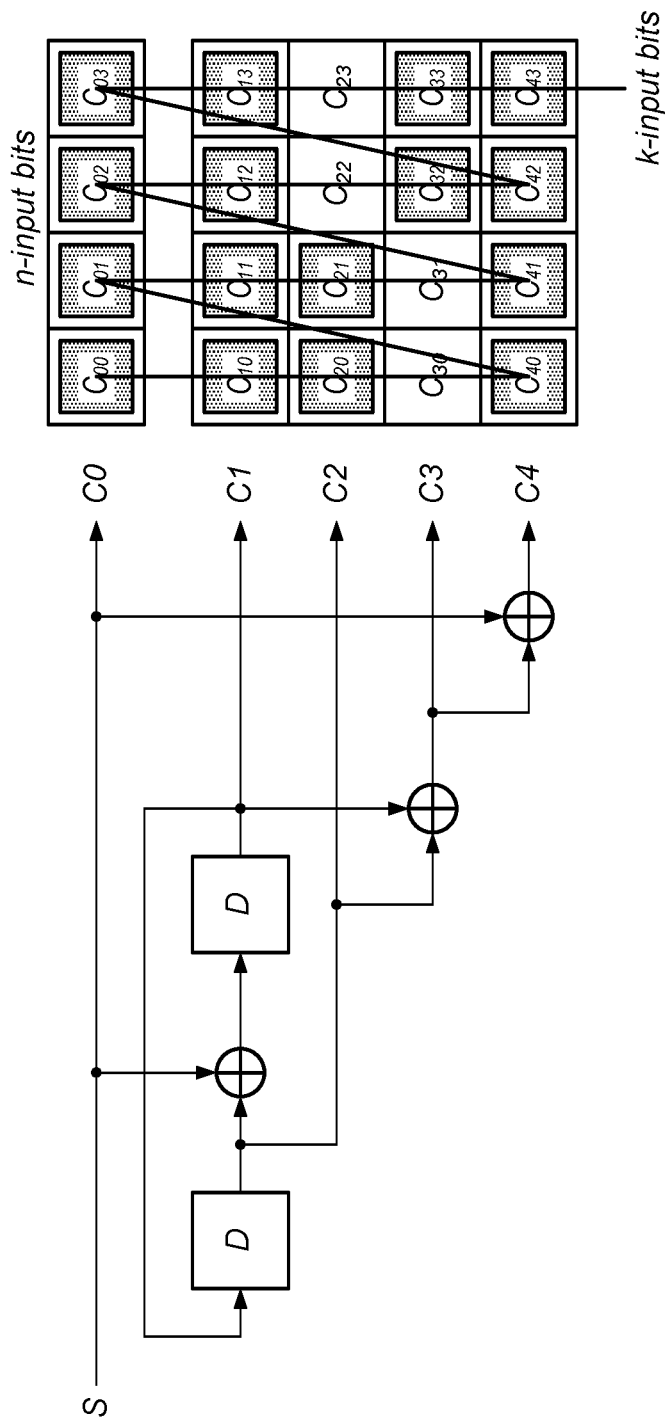
FIG. 4 is an illustration of a four state systematic convolutional encoder according to one embodiment.

One particular embodiment involves the ATSC digital television standard, including M/H services. The ATSC 8VSB transport uses NULL (unassigned) packet IDs to indicate packets with M/H service data, however, there is currently no means to expand (e.g., to create new) M/H services within the M/H framework. The M/H system uses a systematic convolutional encoder (e.g., as shown in FIG. 4) as one means of providing forward error correction. By using a variety of puncturing patterns, this outer encoding can be made at a variety of coding rates, i.e., different ratios of data bits to total (data and coded) bits. This has the potential to allow for dynamic adjustment of a coding rate, e.g., depending on transmission and/or reception conditions. It is further possible to use a puncturing pattern that punctures all of the coded bits, i.e., to us a coding rate of R=1. In other words, an audiovisual stream with R=1 would be uncoded according to the convolutional encoding scheme.

The convolutional coding error correction method may be useful, possibly very useful, or even essential, to current M/H services, however, it is reasonable to expect that in the future it may be supplemented or replaced by additional error correction coding methods. For example, one candidate supplemental or replacement coding method could be systematic block coding. Thus, because the R=1 coding rate may not be appropriate for current services, but may be acceptable for future services, reserving the R=1 coding rate as an indicator of (as yet undetermined) future services within the M/H framework would be one preferred embodiment of uncoded transport tunneling.

Figure 5:
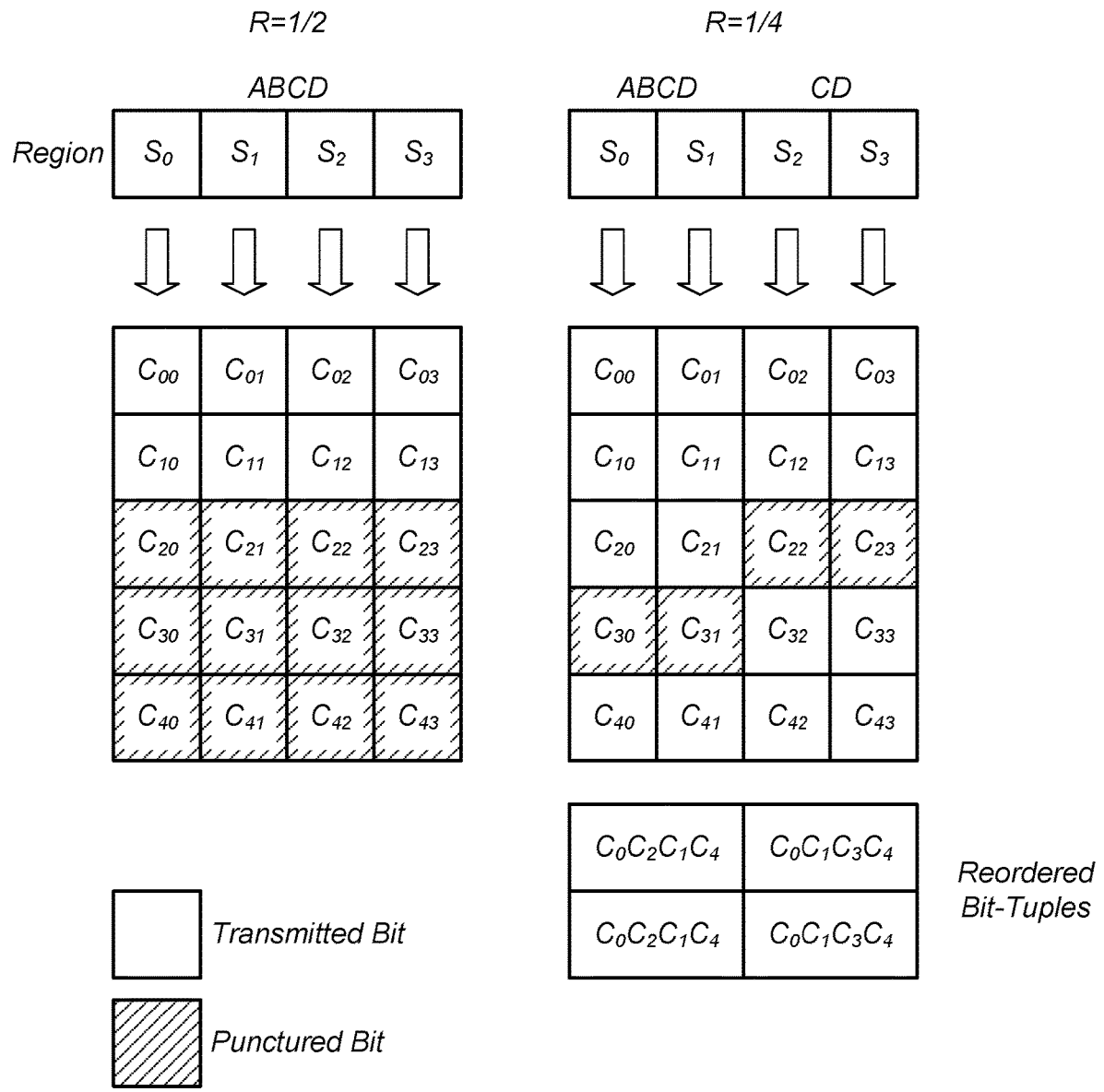
FIG. 5 is an illustration of two basic puncturing patterns resulting in coding rates of R=1/2 and R=1/4 according to one embodiment.
Figure 6:
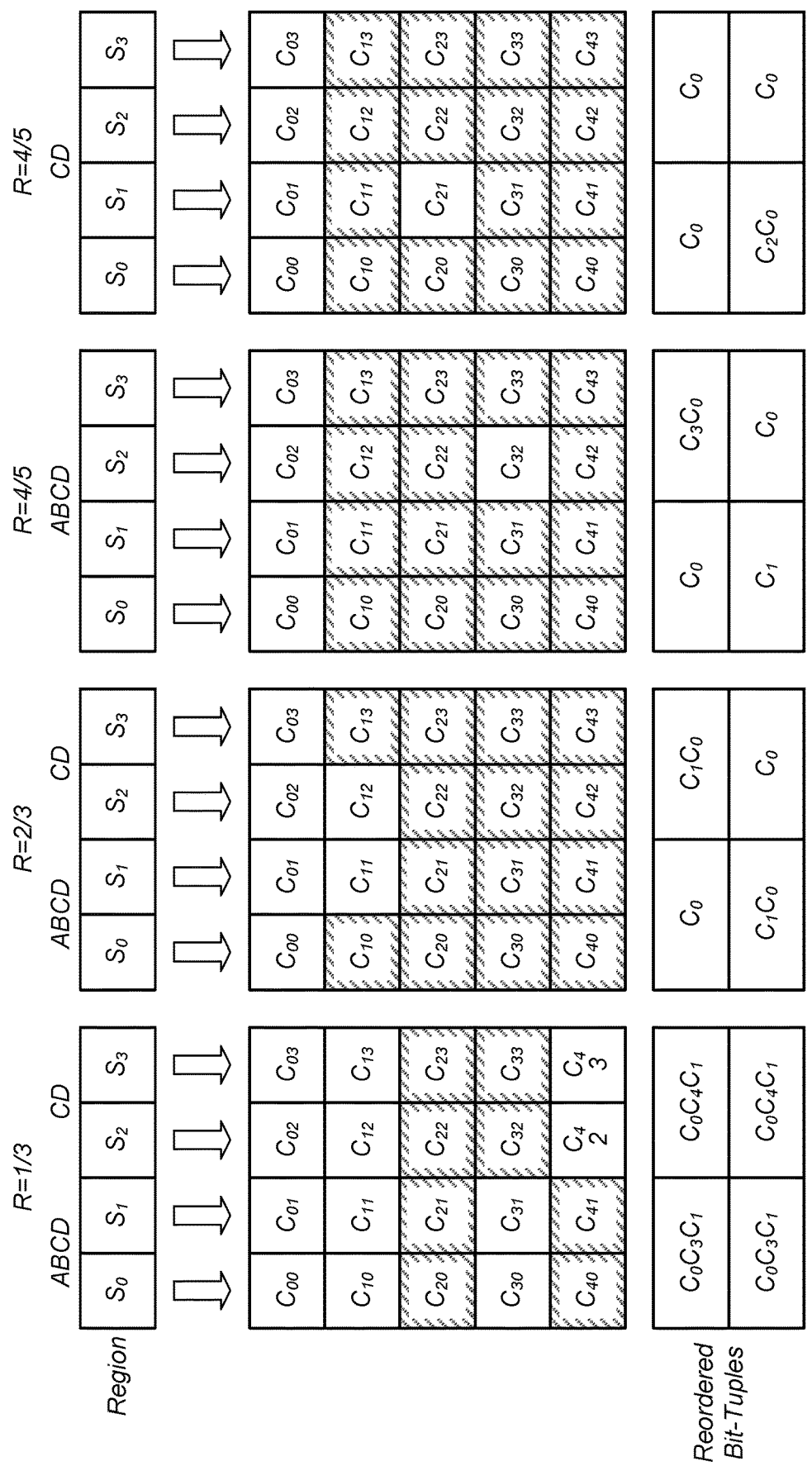
FIG. 6 is an illustration of several additional puncturing patterns resulting in coding rates of R=1/3, R=2/3, and R=4/5 according to one embodiment.

In 202, first audiovisual information may be encoded using a first error correction coding method. The first error correction coding method may be any kind of error correction coding method. In one embodiment, e.g., in the ATSC M/H system, the first error correction coding method may be a convolutional coding method, e.g., a systematic convolutional encoder, such as the one shown and described below with respect to FIG. 4. The first audiovisual information may thus be outer encoded at any of a number of coding rates, as desired, e.g., 1/2, 1/3, 1/4, 2/3, 4/5. Examples of puncturing schemes that would produce such coding rates are shown in FIGS. 5 and 6. In some embodiments, the first audiovisual information may be encoded using an augmented main stream, nested stream encoding, and/or stagger casting, which techniques are described in application Ser. No. 12/472,892 titled "Transmission of Multimedia Streams to Mobile Devices with Cross Stream Association", filed on May 27, 2009, which is hereby incorporated by reference in its entirety as though fully and completely set forth herein.

In 204, a plurality of packets may be generated. The packets may include audiovisual information, e.g., one or more content streams intended for mobile and/or stationary devices. In one embodiment, the packets may be generated according to the ATSC (Advanced Television Standards Committee) DTV (digital television) standard containing one or more digital television channels intended for stationary receivers (e.g., televisions); alternatively, or in addition, the packets may contain one or more digital television channels intended for mobile/handheld (M/H) receivers.

Generation of the packets containing audiovisual information may comprise various steps, such as encoding the audio and video data (e.g., using MPEG-2 encoding), applying forward error correction, generating appropriate packet headers and control information, etc. The forward error correction may take any number of forms, including Reed-Solomon (RS) encoding, Trellis encoding, cyclic redundancy codes (CRCs), or any other form of error correction coding, including a combination of multiple methods. It should be noted that in some embodiments, step 202 (encoding first audiovisual information) may be considered part of step 204 (generating packets of audiovisual information).

The packets may include the first audiovisual information, which may be encoded using the first error correction coding method. The packets may also include second audiovisual information which may not be encoded using the first error correction coding method. For example, again referring to the convolutional encoder of FIG. 4, it is possible to produce an outer coding rate R=1 with an appropriate puncturing pattern. In this case, the second audiovisual information may be processed by the systematic convolutional encoder, but may not include any encoding from it. Although the second audiovisual information may not be encoded using the first error correction coding method, the second audiovisual information may still include some form of error correction. For example, the second audiovisual information may be encoded using a second error correction coding method, e.g., using systematic block codes.

In some embodiments, the first and second audiovisual information may each be located in separate packets; in other words, the first audiovisual information may be located in one or more packets, and the second audiovisual information may be located in one or more different packets. Alternatively, at least a portion of the first audiovisual information may be co-located with at least a portion of the second audiovisual information in one or more of the packets. In other words, there may be one or more packets which include both first audiovisual information and second audiovisual information.

The plurality of packets may also include control information. The control information may be located together with the first and/or second audiovisual information, e.g., in the same packets with the first and/or second audiovisual information; alternatively, the control information may be located separately, e.g., in a different one or more packets than the first and second audiovisual information. The control information may indicate that the second audiovisual information is not encoded according to the first error correction coding method. Thus, the control information may be usable by a receiver (e.g., a mobile device) to determine that the second audiovisual information is not encoded according to the first error correction coding method. This may thereby indicate to the receiver that the second audiovisual information is a different service and/or version than the first audiovisual information.

The control information may also indicate that the first audiovisual information is encoded according to the first error correction coding method (and, in some embodiments, at what coding rate the first audiovisual information is encoded), and/or a variety of other information. For example, in some embodiments, the control information may include information for associating audiovisual streams separated in time and or frequency, as described in application Ser. No. 12/472,892 titled "Transmission of Multimedia Streams to Mobile Devices with Cross Stream Association", incorporated by reference above.

In 206, the plurality of packets may be transmitted. Transmission of the plurality of packets may comprise multiplexing different portions of the plurality of packets (e.g., multiplexing the first audiovisual information, the second audiovisual information, and the control information). Multiplexing of these different packets or streams may be performed based on a ratio of the relative bandwidth allocations of the respective pluralities of packets (or streams). In one embodiment corresponding to continuous mode, multiplexing these different packet streams comprises ordering the packets to distribute them evenly according to their relative bandwidth. In another embodiment corresponding the burst mode, the different packet streams are aggregated in separate bursts preceded by control information (aggregated in its own burst) to indicate the start position of the remaining bursts. The multiplexing may operate to reduce transmission overhead. In one embodiment, the transmission method transmits size information regarding the bandwidth allocations of the various packet streams, wherein the size information is useable at the receiver to demultiplex the received packet streams.

Figure 3:
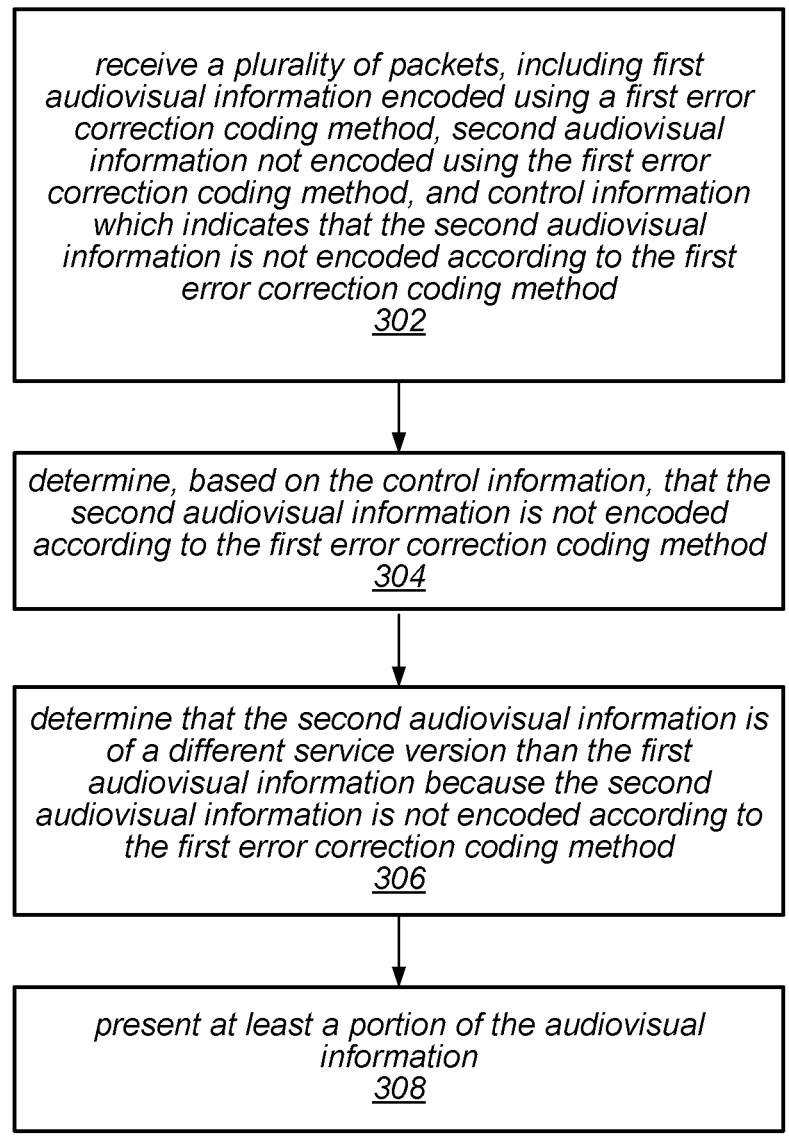
FIG. 3 is a flowchart diagram illustrating a method for a mobile device to wirelessly receive and present audiovisual information.

FIG. 3—Receive Flowchart

FIG. 3 is a flowchart depicting a method for receiving and presenting audiovisual information. The method may be performed by a mobile device such as described above and shown in FIG. 1, e.g., portable computer systems (laptops), wireless telephones (e.g., Blackberrys, iphones, etc.), personal digital assistants, television equipment configured in vehicles, and other types of portable devices capable of displaying received audiovisual information. Alternatively, in some embodiments, the method may be performed by a stationary device, such as also shown in FIG. 1 and described above, e.g., a conventional television, such as liquid crystal display (LCD display) television, a plasma display television, etc. It should be noted that, according to various embodiments, one or more of the steps may be omitted, repeated, or performed in a different order than shown in FIG. 3 and described below.

The method may involve use of uncoded transport tunneling, as described with respect to FIG. 2, as a means for a receiver to distinguish between different services or service versions. The method described below and illustrated by the flowchart in FIG. 3 may be used (e.g., by a mobile device) in combination with the method described above and illustrated by the flowchart in FIG. 2 (e.g., by a transmission system). Thus, many of the elements described below with respect to FIG. 3 may correspond to many of the elements described above with respect to FIG. 2, according to various embodiments.

In 302, a plurality of packets including audiovisual information may be received. The packets may include one or more content streams intended for mobile and/or stationary devices. In one embodiment, the packets may be generated according to the ATSC (Advanced Television Standards Committee) DTV (digital television) standard containing one or more digital television channels intended for stationary receivers (e.g., televisions); alternatively, or in addition, the packets may contain one or more digital television channels intended for mobile/handheld (M/H) receivers. The packets containing audiovisual information may also include error correction coding, such as forward error correction; this may take any number of forms, including but not limited to RS encoding, Trellis encoding, CRCs, or other forms of error correction coding, including a combination of multiple methods.

The plurality of packets may include first audiovisual information encoded using a first error correction coding method. The first error correction coding method may be any kind of error correction coding method. In one embodiment, e.g., in the ATSC M/H system, the first error correction coding method may be a convolutional coding method, e.g., a systematic convolutional encoder, such as the one shown and described below with respect to FIG. 4. The first audiovisual information may thus be outer encoded at any of a number of coding rates, as desired, e.g., 1/2, 1/3, 1/4, 2/3, 4/5. In some embodiments, the first audiovisual information may be encoded using an augmented main stream, nested stream encoding, and/or stagger casting.

The plurality of packets may also include second audiovisual information, which may not be encoded using the first error correction coding method. For example, again referring to the convolutional encoder of FIG. 4, it is possible to use a puncturing scheme that produces an R=1 (i.e., uncoded) coding rate. In this case, the second audiovisual information may have been processed by the systematic convolutional encoder, but may not include any encoding from it. Although the second audiovisual information may not be encoded using the first error correction coding method, the second audiovisual information may still include some form of error correction. For example, the second audiovisual information may be encoded using a second error correction coding method, e.g., using systematic block codes.

In some embodiments, the first and second audiovisual information may each be located in separate packets; in other words, the first audiovisual information may be located in one or more packets, and the second audiovisual information may be located in one or more different packets. Alternatively, at least a portion of the first audiovisual information may be co-located with at least a portion of the second audiovisual information in one or more of the packets. In other words, there may be one or more packets which include both first audiovisual information and second audiovisual information.

The plurality of packets may also include control information. The control information may be located together with the first and/or second audiovisual information, e.g., in the same packets with the first and/or second audiovisual information; alternatively, the control information may be located separately, e.g., in a different one or more packets than the first and second audiovisual information. The control information may indicate that the second audiovisual information is not encoded according to the first error correction coding method.

In 304, it may be determined, based on the control information, that the second audiovisual information is not encoded according to the first error correction coding method. The control information may indicate this to the mobile device in any number of ways. In one embodiment, the coding rate according to the first error correction coding method for each audiovisual stream may be indicated in the control information. Thus, the second audiovisual information may have R=1 according to the first error correction coding method. In contrast, the first audiovisual information might have R=1/2, 1/4, or some other coding rate.

In 306, it may be determined that the second audiovisual information is of a different service version than the first audiovisual information. This determination may be made based on the determination that the second audiovisual information is not encoded according to the first error correction coding method. In other words, the mobile device may be configured to recognize that information which is uncoded according to the first error correction coding method is part of a different service or service version than information which is coded according to the first error correction coding method.

Depending on the configuration of the mobile device, one or more of the audiovisual streams may be usable by the mobile device for presentation. For example, a late model mobile device may be configured to recognize new services (e.g., the second audiovisual information), and thus make use of the R=1 encapsulated audiovisual information. A legacy mobile device, on the other hand, may not be able to use the new service or service version encompassed in the uncoded transport tunnel, and may only be able to use basic service(s) (e.g., the first audiovisual information). If the R=1 tunnel is built into the base framework of the system, a legacy receiver may at least be able to recognize and ignore unsupported services, rather than being rendered partially or entirely inoperable because it tries to parse unsupported services. In other words, in a well designed system, the presence of an uncoded transport tunnel may allow data services to be deployed after an initial service launch and carried together with one or more initial (base) services without interfering with the legacy receiver's ability to receive the basic content of the first audiovisual information.

The audiovisual information (e.g., either the first audiovisual information, the second audiovisual information, or both the first and second audiovisual information, depending on the mobile device) received by the mobile device may in some embodiments also be processed before presentation. Processing the audiovisual information may include performing the inverse of any steps taken in preparing the data for transmission and/or packetizing the data, e.g., demultiplexing the data, decoding any error correction information, decoding the audio and video data, etc. Decoding the error correction information may include both decoding any error correction coding information with the first audiovisual information (e.g., from the first error correction coding method and/or other error correction coding methods), and any error correction information with the second audiovisual information (e.g., from the second error correction coding method and/or other error correction coding methods). It should be noted that the determinations made in both steps 304 and 306 may in some embodiments be considered part of the processing.

In 308, at least a portion of the audiovisual information may be presented. Depending on the mobile device (e.g., whether the mobile device is a legacy or late model device, how the mobile device is configured, etc.), parts or all of the first audiovisual information and/or the second audiovisual information may be presented. Presenting the audiovisual information may include presenting video information on a display and/or presenting audio information on one or more speakers.

FIG. 4—Four State Convolutional Outer Code

Figure 8:
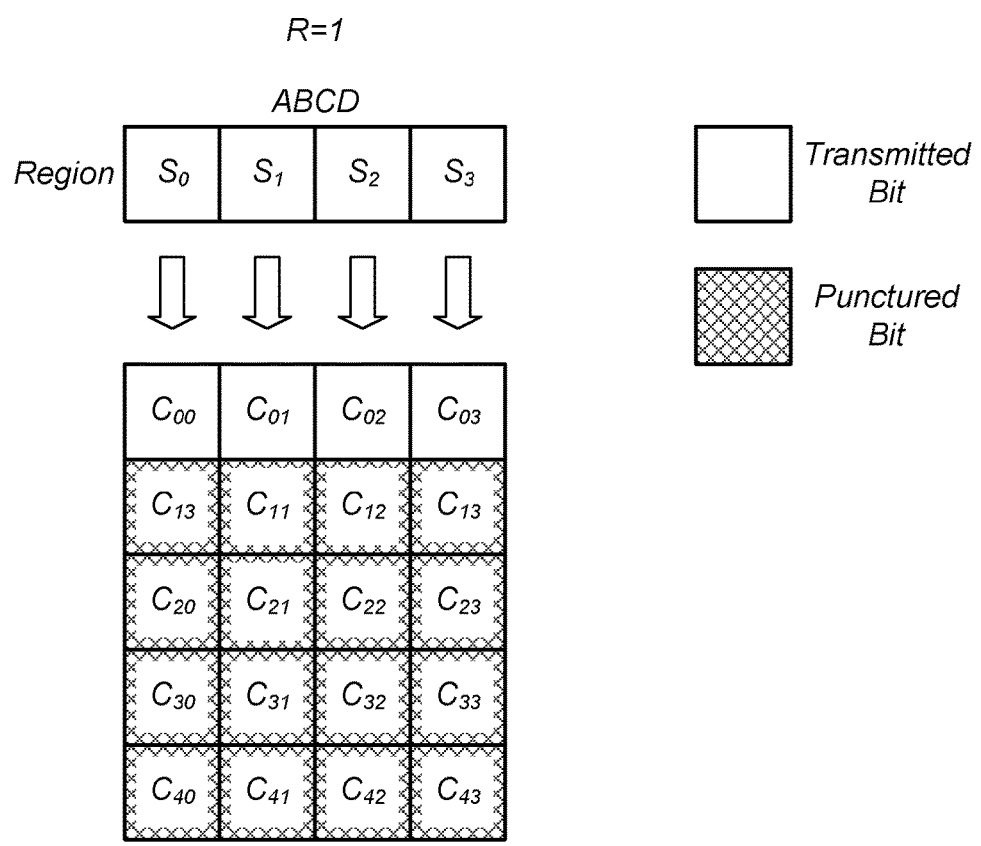
FIG. 8 illustrates a puncturing pattern producing an R=1 (uncoded) coding scheme.

FIG. 4 illustrates a systematic convolutional encoding scheme with R=1/5 and K=3 and a corresponding coding structure. Based on this common structure, a variety of puncturing patterns can be used to derive multiple rates (R=n/k, where there are n-input bits and k-output bits). In a special case, all of the coded bits may be punctured, producing an R=1 coding rate, as shown in FIG. 8. While FIG. 4 shows a particular convolutional encoding scheme which will be referred to for convenience herein, it should be noted that other encoding schemes (e.g., other convolutional encoding schemes or other types of error correction coding schemes) may be used in addition or instead of the scheme shown in FIG. 4 and described herein.

FIG. 5—Basic Puncturing Patterns, Rates 1/2, 1/4

FIG. 5 illustrates two basic puncturing patterns that can be used with the convolutional encoding scheme shown in FIG. 4. As shown, for R=1/2, 2 bits are transmitted for every input, while, for R=1/4, 4 bits are transmitted for every input bit. Given that the outer convolutional encoder is systematic, the input bits are passed to the output unmodified, and reordered in bit-tuples along with the coded data, as shown in FIG. 5.

FIG. 6—Additional Puncturing Patterns, Rates 1/3, 2/3, 4/5

FIG. 6 illustrates several additional puncturing patterns that can be used with the convolutional encoding scheme shown in FIG. 4. As shown, the various puncturing patterns can be used to produce rates of 1/3, 2/3, or 4/5. Other puncturing patterns, producing other rates, are also possible.

Figure 7:
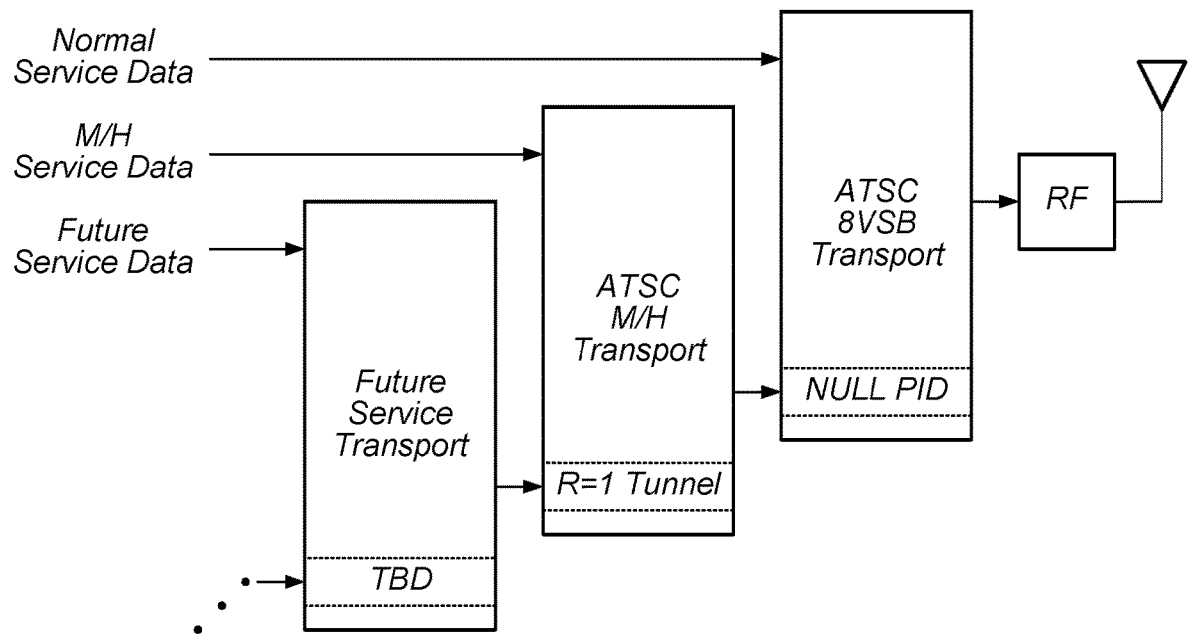
FIG. 7 illustrates inline service multiplexing according to one embodiment.

FIG. 7—Inline Service Multiplexing

FIG. 7 illustrates a system for multiplexing different types of services according to one embodiment. The ATSC standard includes normal service data, e.g., intended for stationary receivers, transported by 8VSB modulation. The ATSC standard has a certain number of reserved (unassigned) Packet ID numbers (PIDs) for expanding new services within the ATSC framework. One such PID is assigned to M/H service data, e.g., services intended for moving receivers. Designing the M/H services with an uncoded R=1 transport tunnel may provide a similar function as the unassigned PIDs, albeit with a different method. In other words, providing for an uncoded transport tunnel in M/H transport may allow future (e.g., enhanced) services to be transported within the M/H framework, and thus also within the ATSC framework.

FIG. 8—R=1 (Uncoded) Coding Scheme

FIG. 8 illustrates a puncturing pattern that could be used with the convolutional encoder of FIG. 6 to produce an R=1 coding scheme. By sending the data bits only, (e.g., puncturing to remove the coded bits entirely), an uncoded transport scheme may be produced, which, in combination with the methods of FIGS. 2 and 3, may be used to carry data from a future (e.g., as yet undefined) service without compromising the integrity of a transport framework, including base services.

Transmit Architecture

Figure 9:
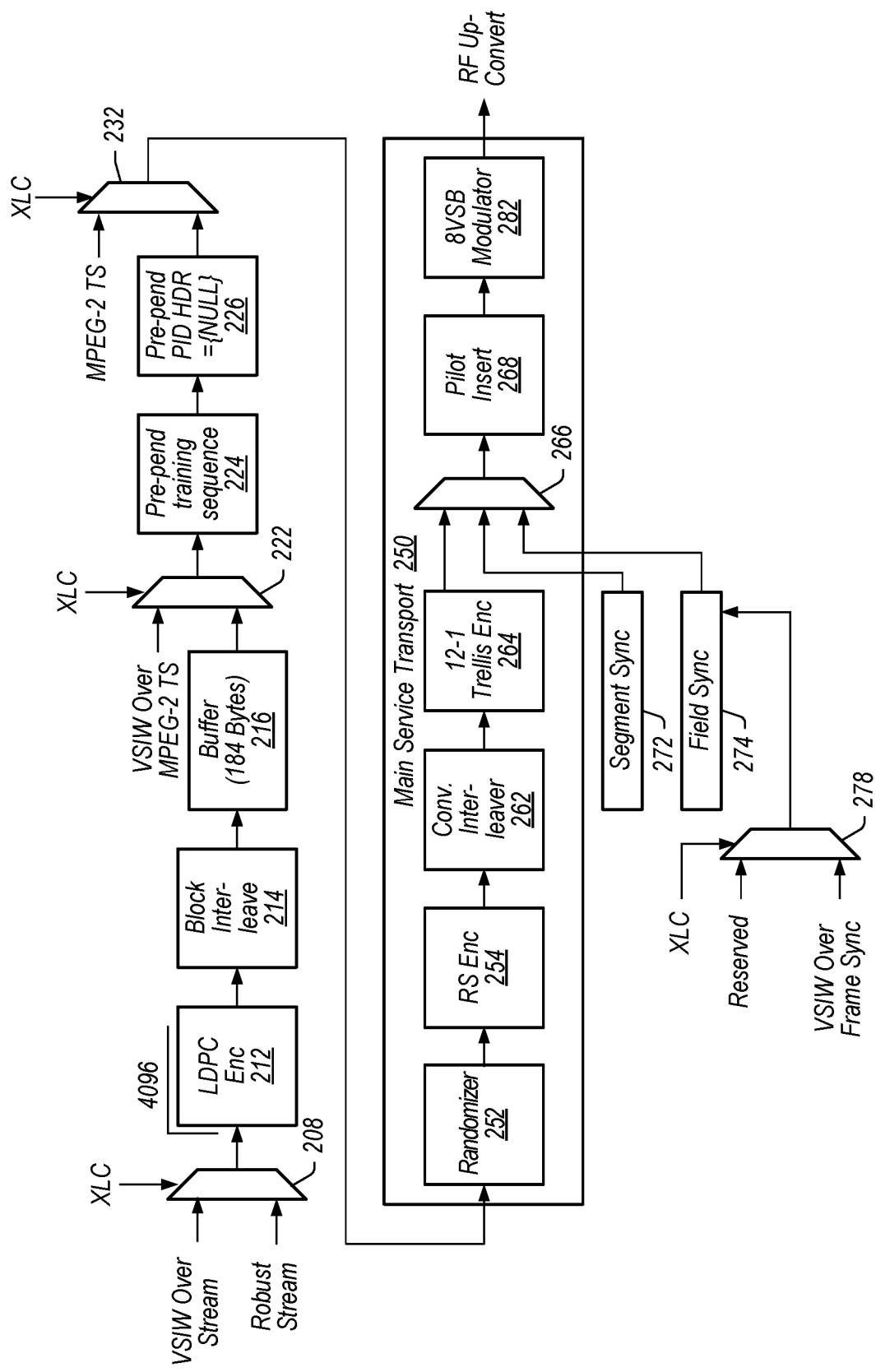
FIG. 9 illustrates a system architecture of a transmitter in the system of FIG. 1.

FIG. 9 is a block diagram of an exemplary transmit architecture which may be comprised in the transmit logic 104. As shown, the transmit architecture may comprise a multiplexer 208 having a first input for receiving a media stream (robust stream) and a second input for receiving first control information (referred to as a VSIW (Variable Stream Instruction Word) Over Stream). The multiplexer 208 includes a control input that receives an XLC signal. The XLC signal determines whether the media stream 204 or the first control information 206 is provided as an output of the multiplexer 208. The output of the multiplexer 208 is provided to a robust encoder 212, e.g. LDPC (Low Density Parity Check).

The robust encoder 212 computes parity check bits based on the transmit data. The robust encoder 212 provides an output to a Block Interleave block 214.

The Block Interleaver block 214 permutes the data block to minimize the impact of burst errors in the transport stream. The Block Interleave block 214 provides its output to Buffer 216. The Buffer 216 is coupled to provide its output to a first input of a multiplexer 222. The second input of the multiplexer 222 receives second control information, referred to as VSIW Over MPEG-2 TS. The multiplexer 222 includes a control input that receives an XLC signal. The XLC signal determines whether the output of the buffer 216 or the second control information 218 is provided as an output of the multiplexer 222. The output of the multiplexer 222 is provided to a Pre-pend training sequence block 224.

The Pre-pend training sequence block 224 attaches the prescribed training sequences ahead of the packet data. The Pre-pend training sequence block 224 provides its output to a Pre-pend PID HDR block 226. The Pre-pend PID HDR block 226 replaces the MPEG-2 TS Header with an unassigned PID header affording backward compatibility to legacy receivers. The Pre-pend PID HDR block 226 provides its output to a first input of a multiplexer 232. The multiplexer 232 includes a second input 234 that receives an MPEG-2 TS (Transport Stream). The multiplexer 232 includes a control input that receives an XLC signal. The XLC signal determines whether the output of the Pre-pend PID HDR block 226 or the MPEG-2 TS 234 is provided as an output of the multiplexer 232. The output of the multiplexer 232 is provided to a Main Service Transport block 250.

The Main Service Transport block 250 comprises a randomizer 252, an encoder 254, e.g., RS (Reed Solomon) encoder, Convolutional Interleaver 262, a Trellis encoder 264, e.g., 12-1 Trellis Encoder, a multiplexer 266, a Pilot insert block 268, and an 8VSB modulator 282.

The randomizer 252 generates a random signal that is provided to the RS encoder 254. The RS encoder performs Reed Solomon coding and provides its output to the Convolutional Interleaver 262. The Convolutional Interleaver 262 permutes the transmitted data bits and provides its output to the Trellis encoder 264.

The Trellis encoder 264 provides its output to a first input of 3 input multiplexer 266. The multiplexer 266 also receives inputs from the Segment Sync block 272 and Field Sync block 274. The Field Sync block 274 receives an input from two input multiplexer 278. The multiplexer 278 receives as a first input a signal VSIW Over Frame Sync. The second input of the multiplexer 278 is currently Reserved and not connected. The multiplexer 278 includes a control input that receives an XLC signal. The XLC signal determines whether the VSIW Over Frame Sync is provided as an output of the multiplexer 278.

The output of the multiplexer 266 is provided to the Pilot insert block 268. The Pilot insert block 268 inserts a pilot tone in accordance with the ATSC 8VSB DTV Specification. The Pilot insert block 268 provides its output to the 8VSB modulator 282. The 8VSB modulator 282 performs 8VSB modulation on the received data and provides an 8VSB modulated output signal to an RF upconverter. The RF upconverter generates an RF (radio frequency) signal which includes the 8VSB modulated signal. The generated RF signal may then be transmitted by transmitter 106.

The Transport Stream Encoding method according to one embodiment of the invention can be described relative to the Main Service Transport as depicted in FIG. 9. The system shown in FIG. 9 provides 3 different mechanisms for inserting control information into the transmitted stream. These 3 different mechanisms are represented by the three multiplexers and 208, 222, and 278. A fourth multiplexer 232 inserts unassigned packets comprising robustly encoded audio visual packet information and the associated control information in the standard transport stream.

In the current embodiment, the following mechanisms supplement the main service transport:

1. Robust Stream—robustly encoded stream multiplexed under XLC control over MPEG-2 TS.
2. VSIW Over MPEG-2 TS—standard encoded VSIW multiplexed under XLC control over MPEG-2 TS.
3. VSIW Over Robust Stream—robustly encoded VSIW multiplexed under XLC control over MPEG-2 TS.
4. VSIW Over Frame Sync—uncoded VSIW inserted under XLC control in the Reserved-byte portion of Field Sync.

The "VSIW Over Frame Sync" signal provides the most robust means for transmitting the control information, but affords the least bandwidth for transporting control information. The "VSIW Over MPEG-2 TS" affords greater bandwidth for transporting control information spread in a manner to provide increased reliability.

Figures 10, 11:
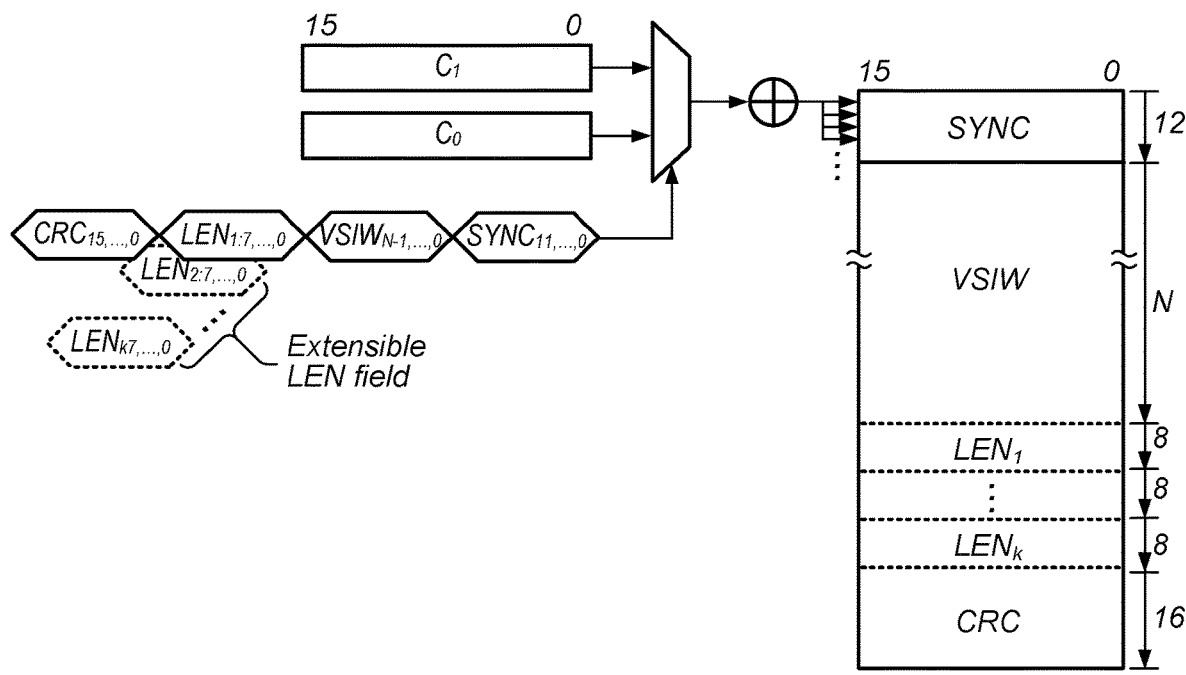
FIG. 10 illustrates a summary of stream encoding methods according to one embodiment of the invention.
FIG. 11 illustrates encoding of command packets in a mobile digital television stream according to one embodiment of the invention, e.g., illustrates VSIW over MPEG-2 transport stream encoding.

From the perspective of stream encoding, each transport method can be characterized in terms of the error protection, modulation/coding and stream synchronization employed, as summarized in the table of FIG. 10. In the table of FIG. 10, 8-VSB under the heading FEC refers to RS+TCM coding employed by the main service transport.

1. Robust Stream

FEC—Referring again to FIG. 9, the Robust Stream encoding supplements the concatenated RS+TCM method of FEC employed in the main stream with a LDPC (Low-Density Parity-Check) block code, the characteristics of which can be summarized as follows: Regular: column weight=3, Systematic: information follows parity (i.e. $[P_{n-k}, \ldots, 0|I_{k-1}, \ldots, 0]$).

1/2-rate coding: [n,k]=[4096, 2048],
1/4-rate coding: [n,k]=[4096, 1024],
1/8-rate coding: [n,k]=[4096, 512].

The block encoder is followed by an N×M block encoder (M=4096, N=M*rate). Interleaved symbols are buffered in an 184-byte block to match the nominal MPEG-2 TS data field length before RS-Encoding.

Modulation and Coding—After encoding, a training sequence is pre-pended to the data field for use by certain receiver configurations. This field may be left empty ([ ]) if not needed. A PID is then pre-pended with the header field set to the prescribed value (zero-padded to the full 3-bytes) before being sent the main service transport. No additional modulation or coding is employed as part of the Robust Stream Encoding.

Stream Synchronization—Synchronization is implicit given that the stream location is known by the receiver.

2. VSIW Over MPEG-2 Transport Stream

FIG. 11 illustrates encoding of command packets in a mobile digital television stream according to one embodiment of the invention. For example, FIG. 11 illustrates VSIW over MPEG-2 transport stream encoding. VSIW Over MPEG-2 TS requires that the VSIW is encoded and placed over Stream 0, known as the Main stream, as shown. The VSIW Over MPEG-2 will share the stream with stream 0 but does not have to be located in any particular place in the stream.

VSIW Over MPEG-2 TS FEC—Multiplexed alongside the MPEG-2 TS, VSIW Over MPEG-2 does not employ additional FEC.

VSIW Over MPEG-2 TS Modulation and Coding is shown in FIG. 11.

As shown, VSIW Over MPEG-2 is inserted at the information bit-level (i.e. ahead of the RS+TCM) and is encoded using a pair of length-16 Gold codes ($\{C_0, C_1\} = [2271_{16}, 7B28_{16}]$). Derived from an orthogonal codebook, $\{C_0, C_1\}$ provide additional protection in the form of signal processing gain over an individually coded bit.

Transported in 16-bit groupings, each codeword is modulated (i.e. selected) according to the intended information content, the result of which represents a single un-coded bit in the VSIW stream. The $C_0$ codeword is inserted whenever a '0' occurs in the VSIW stream; $C_1$ is sent whenever a '1' occurs thus occupying 2-bytes in the transport stream for each inserted information bit.

The SYNC sequence (SYNC=$7712_8$) provides a mechanism to reliably detect the VSIW stream start. The modulated code sequences [$C \in \{C_0, C_1\}$], selected according to bit content, provide inherent signal processing/spreading gain improving the reliability of stream communication relative to any bit transmitted individually.

FIG. 12 summarizes the stream framing parameters. Each bit in the stream is modulated using the length-16 codes as described above with spreading applied across SYNC|LEN-|VSIW|CRC, indiscriminately.

VSIW Over MPEG-2 TS Stream Synchronization—SYNC is inserted at the start of each stream to assist the receiver in locating VSIW Over MPEG-2, potentially inserted anywhere within an 8-VSB frame. Once detected, the sync field establishes the start of the intended information field. The remaining message stream is processed thereafter until the stream end is reached as indicated by the LEN field.

3. VSIW Over Robust Stream

VSIW Over Robust Stream is an extension of the robust transport method permitting VSIW to be communicated over MPEG-2 TS with extra error protection as described above for the Robust Stream Encoding.

The VSIW only carries information relative to the stream that it is being transported under. The VSIW also must be placed at the start of a stream frame where a stream frame is the recycle point in the stream.

VSIW Over Robust Stream FEC—VSIW Over Robust Stream employs the same additional FEC, i.e. LDPC, as that used for the Robust Stream Encoding.

VSIW Over Robust Stream Modulation and Coding—VSIW Over Robust Stream uses the same code-spread modulation employed in VSIW Over MPEG-2 with the exception the SYNC field is omitted to conserve bandwidth.

The process for coding VSIW Over Robust Stream can be outlined as follows:

Concatenate LEN|DATA|CRC (at the information bit level),

Modulate by a pair of length-16 orthogonal code sequences as described above,

LDPC encode according to the robust stream method,

Buffer and pre-pend unassigned PID header+training sequence (if needed),

Insert in the MPEG-2 transport stream MUX.

VSIW Over Robust Stream Synchronization—Synchronization is implicit in that the stream location is known by the receiver. For this reason the VSIW Over Robust Stream must be placed at the start of a stream frame where a stream frame is the recycle point in the stream.

4. VSIW Over Field Segment Sync

As described by the ATSC A/53 standard, 82 of the 92 reserved symbols in the field segment sync are available to support extension of the standard. This is where the VSIW packet transmission occurs.

VSIW Over Field Sync FEC—VSIW Over Field Sync bypasses both the standard RS+TCM and robust encoding methods.

VSIW Over Field Sync Modulation and Coding—Inserted at the modulated signal level, VSIW Over Field Sync uses the 2-level (i.e. ±5) modulation employed in the surrounding sync symbols. Unlike the other VSIW methods, code-spread modulation is abandoned (along with the [SYNC] LEN|DATA|CRC frame structure) given the limited bandwidth afforded a Field Sync and the succinct nature of the communication.

VSIW Over Field Sync Stream Synchronization—Synchronization is implicit in that the stream location and length are known by the receiver.

Receive Architecture

Figure 13:
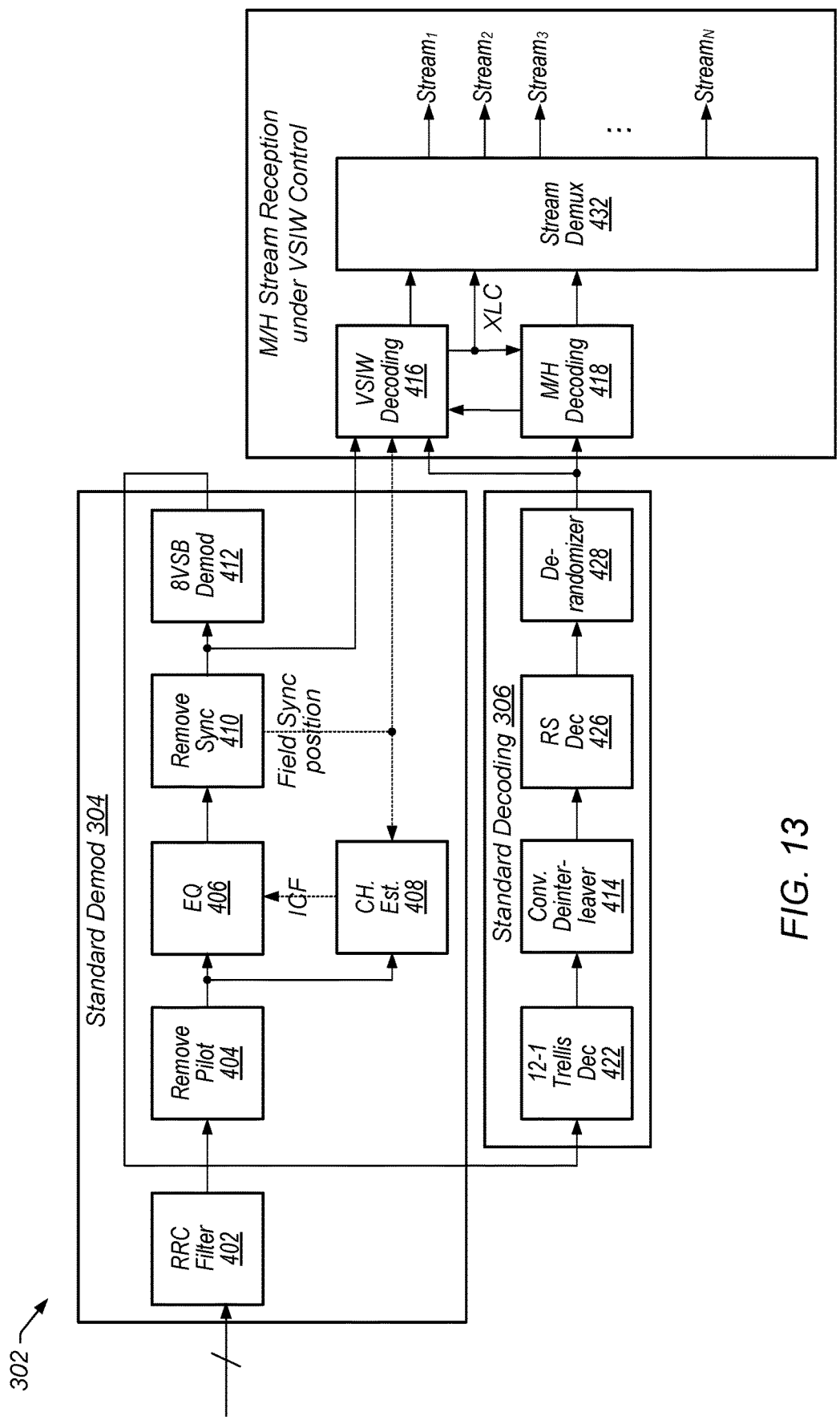
FIG. 13 illustrates a system architecture of a receiver in an exemplary mobile device according to one embodiment of the invention.

FIG. 13 illustrates a receive architecture in a mobile device 112 according to one embodiment of the invention.

More particularly, FIG. 13 illustrates an overview of digital RX processing that may be performed in the receiver of a M/H device 112. As shown, receiver 302 comprises Standard Demodulation 304, Standard Decoding 306 and M/H Stream Reception under VSIW Control block 308. The receiver 302 decodes an input signal yielding a stream of receive symbols at the output of the Standard 8VSB Demodulator 304. The output of the Standard Demodulator 304 is passed to the Standard Decoder 306 producing a standard 8VSB transport stream. The VSIW Decoder 416 is configured to search the receive signal for control packet information at the output of the Standard Decoder 306, the output of the M/H Decoder 418 and the output of Sync removal 410 corresponding to VSIW over MPEG-2 TS, VSIW over Robust Stream and VSIW of Field Segment Sync, respectively. M/H decoding 418 is applied in accordance with XLC commands recovered from VSIW decoding 416. The received transport stream is de-multiplexed 432 to produce a plurality of audiovisual streams corresponding to mobile and/or fixed services. The receiver 302 may be implemented in any of various ways.

The signal processing stage operates to provide channel selection and filtering such that symbol data (3 bits) may be processed in subsequent stages. The signal processing may be performed by both analog (hardware) and digital (software). Analog signal processing may be performed by an RF Tuner, IF Filter and analog-to-digital conversion (not shown). Digital signal processing (DSP) comprises the rejection filters, equalizer 406 and phase tracker.

The receiver 302 operates to remove (e.g., deconvolve) any unwanted channel effects from the received symbol stream. These effects include co-channel interference (e.g. NTSC), multi-path dispersion and Doppler shifting. The deconvolved data is then analyzed to determine what adjustments are needed to the RF Tuner to improve symbol recovery.

As shown in FIG. 13, the received signal is provided to a Root Raised Cosine (RRC) filter block 402 which operates to filter the signal to match the RRC response applied at the transmitter. The RRC filter block 402 provides its output to a Remove Pilot block 404.

The Remove Pilot block 404 removes the DC-offset introduced by the pilot tone. The Remove Pilot block 404 provides its output to an EQ block 406 and to a Chanel Estimation block 408.

The EQ block 406 reverses the channel effects estimated from the received signal. The EQ block 406 provides its output to a Remove Sync block 410.

The Remove Sync block 410 provides Field Sync position information to the Channel Estimation block 408 and to VSIW Decoding block 416. The Remove Sync block 410 provides an output to an 8VSB Demodulation block 412

The Chanel Estimation block 408 operates to determine the appropriate inverse channel response.

The 8VSB Demodulation block 412 performs 8VSB demodulation on the signal and provides an output to Mobile/Handheld (M/H) Decoding block 414. The 8VSB Demodulation block 412 also provides an output to 12-1 Trellis Decoder 422. The Trellis Decoder 422 performs Trellis decoding on the received signal and provides an output to Convolutional Deinterleaver 414. The Convolutional Deinterleaver 414 reverses the bit permutation introduced by the Convolutional Interleaver. The Convolutional Deinterleaver 414 provides an output to Reed Solomon (RS) Decoder 426. The RS Decoder 426 performs block decoding. The RS Decoder 426 provides an output to De-randomizer 428. The De-randomizer 428 provides an output to VSIW Decoding block 416 and Stream Demultiplexer block 432.

The M/H Decoding block 418 applies the additional FEC associated with the M/H transport as directed by the VSIW Decoding block 416.

The VSIW Decoding block 416 operates to decode command information (VSIW commands) from received packets. The VSIW Decoding block 416 accepts input from three separate locations in the transport corresponding to VSIW over MPEG-2 Transport Stream taken at the output of the De-randomizer, VSIW Over Robust Stream taken at the output of the M/H Decoding block and VSIW Over Field Segment Sync taken at the output of the Remove Sync block, respectively. The VSIW Decoding block 416 provides cross layer control (XLC) information to the M/H Decoding block 414 and to Stream Demultiplexer 422. The XLC information comprises parameter settings destined for endpoints in the tree structure along with commands to traverse nodes in the tree as well as relative bandwidth and per stream coding rates needed to determine the multiplexing arrangement. The XLC information is discussed in greater detail below.

The M/H Decoding block 418 and the VSIW Decoding block 416 are coupled to a Stream Demultiplexer 432. The Stream Demultiplexer 432 demultiplexes the various streams from the received signal to generate various individual audiovisual streams (e.g., digital television channels).

The signal processing stage operates to provide channel selection and filtering such that symbol data (3 bits) may be processed in subsequent stages. The signal processing may be performed by both analog (hardware) and digital (software). Analog signal processing may be performed by an RF Tuner, IF Filter and analog-to-digital conversion. Digital signal processing (DSP) comprises the rejection filters, equalizer 406 and phase tracker.

The receiver is configured to remove (i.e. deconvolve) any unwanted channel effects from the received symbol stream. These effects include co-channel interference (e.g. NTSC), multi-path dispersion and Doppler shifting. The deconvolved data is then analyzed to determine what adjustments are needed to the RF Tuner to improve symbol recovery.

As described herein, embodiments of the invention may use the presence, or lack of presence, of an error correction coding method to signal a new service and/or service version. Examples of new services and/or service versions that may be signaled in this manner include the incorporation of new coding methods, e.g. LDPC or other systematic block code methods, R-S product coding which augments the legacy R-S code (row-wise parity) with additional column-wise parity, as well as systematic encoding to enable nested stream encoding or PHY staggercasting providing transport diversity in time and/or frequency. Various other types of new services and/or new service versions are also contemplated.

Although the embodiments above have been described in considerable detail, numerous variations and modifications will become apparent to those skilled in the art once the above disclosure is fully appreciated. It is intended that the following claims be interpreted to embrace all such variations and modifications.

We claim:

1. A method for transmitting an audiovisual stream to a mobile device in a wireless manner, wherein the mobile device comprises a receiver implementing a physical layer, the method comprising:

generating a first plurality of packets, wherein the first plurality of packets comprises audiovisual information;

generating control information, wherein the control information comprises commands for modifying operation of the physical layer by the receiver, wherein said modified operation comprises modifying the processing of audiovisual information by the receiver in the physical layer;

modulating the control information using a pseudorandom sequence to obtain encoded control information, wherein the pseudorandom sequence is known by the mobile device;

generating a second plurality of packets, wherein the second plurality of packets comprises the encoded control information;

transmitting the plurality of packets to the mobile device in a wireless manner, wherein the plurality of packets comprises the first plurality of packets and the second plurality of packets.

2. The method of claim 1, wherein said transmitting is performed by a transmit system, the method further comprising:

receiving an instruction to modify operation of the transmit system;

modifying operation of the transmit system based on the instruction;

wherein said generating the control information comprises:

determining at least one first modification to the physical layer in the receiver based on the instruction;

generating one or more commands configured to make the at least one first modification to the physical layer in the receiver.

3. The method of claim 2, wherein said generating the control information further comprises:

examining current parameters of the physical layer;

determining at least one modification to at least one second communication layer in the receiver based on said examining; and generating one or more commands configured to make the at least one modification to the at least one second communication layer in the receiver.

4. The method of claim 2, wherein said generating the control information further comprises:

examining current parameters of the physical layer;

determining at least one second modification to the physical layer in the receiver based on said examining; and generating one or more commands configured to make the at least one second modification to the physical layer in the receiver.

5. The method of claim 1, wherein said transmitting comprises transmitting the plurality of packets to the mobile device over a wireless communication medium;

the method further comprising:

determining channel conditions of the wireless communication medium;

determining at least one first modification to the physical layer based on the channel conditions of the wireless communication medium;

wherein said generating control information comprises generating one or more commands configured to make the at least one first modification to the physical layer in the receiver.

6. The method of claim 5,
wherein said generating the control information further comprises:
examining current parameters of a plurality of communication layers;
determining at least one modification to at least one second communication layer in the receiver based on said examining; and
generating one or more commands configured to make the at least one modification to the at least one second communication layer in the receiver.

7. The method of claim 5,
wherein said generating the control information further comprises:
examining current parameters of a plurality of communication layers;
determining at least one second modification to the physical layer in the receiver based on said examining; and
generating one or more commands configured to make the at least one second modification to the physical layer in the receiver.

8. The method of claim 1, wherein the control information further comprises commands for modifying one or more parameters in one or more of:
a presentation layer in the mobile device; and
a management layer in the mobile device.

9. The method of claim 1, wherein the control information further comprises at least one command for changing one or more of:
a codec type used by the mobile device;
a transport configuration of packets received by the mobile device;
signaling used in packets received by the mobile device;
an announcement used in packets received by the mobile device;
an amount of forward error correction applied to received packets;
an encoding scheme used by the mobile device; and
a modulation scheme used by the mobile device.

10. The method of claim 1,
wherein said transmitting the plurality of packets comprises:
transmitting the first plurality of packets comprising the audiovisual information; and
transmitting the second plurality of packets comprising the control information;
wherein the audiovisual information comprises audiovisual information meant for stationary devices, wherein the first plurality of packets comprise additional error correction intended to improve mobile reception of the audiovisual information meant for stationary devices.

11. A transmission system for transmitting audiovisual information to a mobile device, wherein the mobile device comprises a receiver implementing a physical layer, the transmission system comprising:
transmit logic configured to:
generate a first plurality of packets, wherein the first plurality of packets comprises audiovisual information;
generate control information, wherein the control information comprises commands for modifying operation of the physical layer by the receiver, wherein said modified operation comprises modifying the processing of audiovisual information by the receiver in the physical layer;
modulate the control information using a pseudorandom sequence to obtain encoded control information, wherein the pseudorandom sequence is known by the mobile device; and
generate a second plurality of packets, wherein the second plurality of packets comprises the encoded control information; and
a transmitter coupled to the transmit logic and configured to:
transmit the plurality of packets to the mobile device in a wireless manner, wherein the plurality of packets comprises the first plurality of packets and the second plurality of packets.

12. The transmission system of claim 11,
wherein the transmission system is configured to receive an instruction to modify operation of the transmission system and modify operation of the transmission system based on the instruction;
wherein, in generating the control information, the transmit logic is configured to:
determine at least one first modification to the physical layer in the receiver based on the instruction; and
generate one or more commands configured to make the at least one first modification to the physical layer in the receiver.

13. The transmission system of claim 11,
wherein, in generating the control information, the transmit logic is configured to:
examine current parameters of a plurality of communication layers;
determine at least one modification to at least one second communication layer in the receiver based on said examining; and
generate one or more commands configured to make the at least one modification to the at least one second communication layer in the receiver.

14. The transmission system of claim 11,
wherein the transmitter is configured to transmit the plurality of packets to the mobile device over a wireless communication medium;
wherein the transmit logic is further configured to:
determine channel conditions of the wireless communication medium; and
determine at least one first modification to the physical layer based on the channel conditions of the wireless communication medium;
wherein, in generating the control information, the transmit logic is configured to generate one or more commands configured to make the at least one first modification to the physical layer in the receiver.

15. The transmission system of claim 11,
wherein in transmitting the plurality of packets, the transmitter is configured to:
transmit the first plurality of packets comprising the audiovisual information; and
transmit the second plurality of packets comprising the control information;
wherein the audiovisual information comprises audiovisual information meant for stationary devices, wherein the first plurality of packets comprise additional error correction intended to improve mobile reception of the audiovisual information meant for stationary devices.

16. A memory medium storing program instructions for generating packets for transmission of audiovisual information to a mobile device in a wireless manner, wherein the mobile device comprises a receiver implementing a physical layer, wherein the program instructions are executable to cause a transmission system to:

generate a first plurality of packets, wherein the first plurality of packets comprises audiovisual information;

generate control information, wherein the control information comprises commands for modifying operation of the physical layer by the receiver, wherein said modified operation comprises modifying the processing of audiovisual information by the receiver in the physical layer;

modulate the control information using a pseudorandom sequence to obtain encoded control information, wherein the pseudorandom sequence is known by the mobile device;

generate a second plurality of packets, wherein the second plurality of packets comprises the encoded control information; and transmit the plurality of packets to the mobile device in a wireless manner, wherein the plurality of packets comprises the first plurality of packets and the second plurality of packets.

17. The memory medium of claim 16, wherein the program instructions are further executable to cause the transmission system to receive an instruction to modify operation of the transmission system and modify operation of the transmission system based on the instruction;

wherein, in generating the control information, the program instructions are further executable to cause the transmission system to:

determine at least one first modification to the physical layer in the receiver based on the instruction; and generate one or more commands configured to make the at least one first modification to the physical layer in the receiver.

18. The memory medium of claim 16, wherein, in generating the control information, the program instructions are further executable to cause the transmission system to:

examine current parameters of a plurality of communication layers;

determine at least one modification to at least one second communication layer in the receiver based on said examining; and generate one or more commands configured to make the at least one modification to the at least one second communication layer in the receiver.

19. The memory medium of claim 16, wherein the program instructions are further executable to cause the transmission system to transmit the plurality of packets to the mobile device over a wireless communication medium; and wherein the program instructions are further executable to cause the transmission system to:

determine channel conditions of the wireless communication medium; and determine at least one first modification to the physical layer based on the channel conditions of the wireless communication medium;

wherein, in generating the control information, the program instructions are further executable to cause the transmission system to generate one or more commands configured to make the at least one first modification to the physical layer in the receiver.

20. The memory medium of claim 16, wherein, in transmitting the plurality of packets, the program instructions are further executable to cause the transmission system to:

transmit the first plurality of packets comprising the audiovisual information; and transmit the second plurality of packets comprising the control information;

wherein the audiovisual information comprises audiovisual information meant for stationary devices, wherein the first plurality of packets comprise additional error correction intended to improve mobile reception of the audiovisual information meant for stationary devices.

\* \* \* \* \*